(12) United States Patent
Meyer et al.

(10) Patent No.: US 8,377,343 B2
(45) Date of Patent: Feb. 19, 2013

(54) OPTICAL FUNCTION LAYERS, IN PARTICULAR ZINC-OXIDE SULFIDE LAYERS, EXHIBITING VARIABLE DIELECTRIC RESPONSES

(75) Inventors: Bruno K. Meyer, Grossen-Linden (DE); Baker Farangis, Giessen (DE); Detlev Hofmann, Hüttenberg (DE); Thorsten Krämer, Giessen (DE); Angelika Polity, Bad Nauheim (DE)

(73) Assignee: Justus-Liebig-Universität Giessen, Giessen (DE)

( * ) Notice: Subject to any disclaimer, the term of this patent is extended or adjusted under 35 U.S.C. 154(b) by 1444 days.

(21) Appl. No.: 10/571,067

(22) PCT Filed: Sep. 7, 2004

(86) PCT No.: PCT/DE2004/002000
§ 371 (c)(1),
(2), (4) Date: Feb. 12, 2007

(87) PCT Pub. No.: WO2005/024612
PCT Pub. Date: Mar. 17, 2005

(65) Prior Publication Data
US 2007/0269599 A1 Nov. 22, 2007

(30) Foreign Application Priority Data
Sep. 8, 2003 (DE) .................................. 103 41 681

(51) Int. Cl.
F21V 9/04 (2006.01)
F21V 9/06 (2006.01)
G02B 5/22 (2006.01)
G02B 5/26 (2006.01)
H01L 33/00 (2010.01)
C23C 16/00 (2006.01)

(52) U.S. Cl. ............ 252/589; 257/13; 257/22; 257/103; 257/613; 257/614; 313/506; 427/255.18; 428/446

(58) Field of Classification Search ............. 427/255.18; 428/446; 257/89, 13, 22, 103, 613, 614; 313/506; 252/589
See application file for complete search history.

(56) References Cited

U.S. PATENT DOCUMENTS

| 6,033,752 A * | 3/2000 | Suzuki et al. ................ 428/64.1 |
| 2002/0014631 A1* | 2/2002 | Iwata et al. ..................... 257/89 |
| 2003/0042851 A1 | 3/2003 | Iwata et al. |

FOREIGN PATENT DOCUMENTS

EP 1 178 543 A1 2/2002

OTHER PUBLICATIONS

Y.-Z. Yoo, Zheng-Wu Jin, and T. Chikyow, T. Fukumura and M. Kawasaki,H. Koinuma, S doping in ZnO film by supplying ZnS species with pulsed-laser-deposition method, Appl. Phys. Lett., vol. 81, No. 20, Nov. 11, 2002, © 2002 American Institute of Physics.*
Y.Z. Yoo, et al., "S Doping in ZnO Film by Supplying ZnS Species With Pulsed-Laser-Deposition Method", Applied Physics Letters, vol. 81, No. 20, Nov. 11, 2002, pp. 3798-3800.
Charlotte Platzer-Bjorkman, et al., Atomic Layer Deposition of Zn(O,S) Buffer Layers for High Efficiency Cu(In,Ga)Se$_2$ Solar Cells, 3rd World Conference on Photovoltaic Energy Conversion, Osaka, Japan, May 11-13, 2003, pp. 461-464.
E.B. Yousfi, et al., "Cadmium-Free Buffer Layers Deposited by Atomic Later Epitaxy for Copper Indium Diselenide Solar Cells", Thin Solid Films 361-362 (2000), pp. 183-186.
B.W. Sanders, "Zinc Oxysulfide Thin Films Grown by Atomic Layer Deposition", Chem. Mater., 1992, 4, pp. 1005-1011.
Tom Orent, "Stress Modification in Sputtered Zinc Sulfide and Zinc Oxysulfide Thin Films", J. Vac. Sci. Technol. A9(4), Jul./Aug. 1991, pp. 2447-2452.
C.D. Lokhande, et al., "Preparation of $Zn_x(O,S)_y$ Thin Films Using Modified Chemical Bath Deposition Method", Applied Surface Science 187 (2002), pp. 101-107.

* cited by examiner

*Primary Examiner* — Bijan Ahvazi
(74) *Attorney, Agent, or Firm* — Clark & Brody

(57) ABSTRACT

The invention relates to a novel optical function layer and its production, the function layer imparting to materials coated with it protection against uv radiation while transmitting electromagnetic radiation of larger wavelengths. The function layer of the invention and the manufacturing method of the invention offer advantages over the state of the art by allowing very accurate and precise adjustability in the uv range of the relatively sharp absorption constant.

10 Claims, 3 Drawing Sheets

OPTICAL FUNCTION LAYERS, IN PARTICULAR ZINC-OXIDE SULFIDE LAYERS, EXHIBITING VARIABLE DIELECTRIC RESPONSES

DESCRIPTION AND STATE OF THE ART

The present invention relates to optical function layers that may be deposited on materials or substrates requiring protection, such as mineral glass, plexiglass foils, and that prevent transmitting incident light beyond a given wavelength which most of the time is set during production in order to preclude actinic damage.

In particular the present invention relates to a function layer of $ZnO_xS_{1-x}$ of which the transmission or absorption changes abruptly within a previously adjustable range of wavelengths, furthermore to such a layer that is electrically conducting. Again the present invention relates to a method for making such layers.

Materials may be altered or damaged by light irradiation. Illustratively such radiation may damage biological tissue by burning (sunburn), it may affect functional molecule structures in organic, electro-optical components light-emitting diodes (OLed's), or organic solar cells, or solids, or pigment dyes as used in pictures, or window coatings fitted with electrically switchable transmission (electrochromic windows).

This problem is solved in the state of the art by using filters which transmit the light across a range of long wavelengths with minimal interference and which, starting at a given wavelength $\lambda_0$, cut it off as sharply and completely as possible. This given wavelength depends on the damage mechanism of the light on the material to be protected. As a rule these filters are made of dyed glass. Each filtering function then entails a separate melt with the appropriate additives. However such filters generally exhibit a wide transition range at $\lambda_0$ Improvements are attained by combination with interference filters. Because of the decrease in the ozone layer in the polar regions, the need has arisen to provide appropriate protection also in buildings. Float glass being applicable for such purposes only on a limited scale, materials are being searched for which on one hand shall transmit visible sunlight substantially unrestrictedly while on the other hand cutting off uv-light almost entirely.

Transparent, conductive oxides (TCO) such as $In_2O_3$:Sn (ITO); ZnO:Al, $SnO_2$:F are commonly used which as a rule are prepared pyrolysis or by sputtering. However they exhibit high transmission in the ultraviolet spectrum, and its absorption edge cannot be modified.

It is known that alloys or mixtures of dielectric materials may exhibit properties between or outside (bowing) those of the original substances. This feature could be empirically ascertained both by anion and cation substitution.

Sulfur doping of ZnOx layers was carried out on ZnO layers which were prepared by alternating pulsed laser deposition (PLD) of two ceramic targets (ZnO/ZnS) on sapphire and resulted in increased uv absorption at a maximum proportion of 14% sulfur in ZnO (Y. Z. Yoo et al, Appl. Phys. Letters, 81, 3798 [2002]). However the serious drawback also is incurred that there is considerably widening of the absorption constant at high sulfur concentrations because extraneous/foreign phases will form, further that the ZnO absorption edge can be shifted toward the uv range by alloying with MgO (3.4 to 4.0 ev) or in the direction of visible spectral ranges with CdO (3.3 to 3.0 ev) (T. Makino et al, Appl. Phys. Lett. 78, 1237 (2001)).

Heretofore, however, no ternary compound has been synthesized that might cover the region from 3.7 ev to 2.5 ev.

In the US 2003 0042851 A1 patent document (Iwata et al), a quaternary ZnOSSe layer is deposited on silicon substrates that shall be used a light emitting component. The bandgap energies for ZnSSe, ZnOS and ZnOSe are estimated by theoretical calculations. The bandgap energy is found to vary as a function of the quaternary compound composition from the uv range through the visible range into the infrared range. Empirical results are available only for ZnOSe (not for ZnSSe, not for ZnOS) having a maximal proportion of 15% Se, which also was prepared by PLD.

In particular no procedure was disclosed to prepare mixed systems of ZnOS. Presently no other literature is known offering a realistic preparation of a ZnOS system.

Heretofore dielectric layers have been used to attain abrupt absorption edges defined by the material properties. This methodology however precludes maximum transmission above a desired wavelength at minimum transmission below said wave length.

In order to circumvent difficulties (widening the absorption edge) of the PLD procedure to prepare $ZnO_xS_{1-x}$ it is present practice to resort to industrial methods for making ZnO. Reactive sputtering of metallic Zn targets with addition of oxygen and/or metal Zn targets have been used. Even when using such procedures, it has been impossible to separate alloy layers from ZnOS; deposition only took place in ranges predominantly containing O or S (about 90%), whereas the desired Co deposition could not be ascertained.

Such difficulties can be circumvented effectively by using ceramic ZnO targets. However further progress, namely making alloys, could not be observed in this procedure over a wide range of performance, temperature and H2S flow.

PURPOSE OF THE PRESENT INVENTION

Accordingly the objective of the present invention is to create an optical function layer offering a sharp, adjustable absorption constant and maximum transmission above the desired wavelength and minimum transmission below it in the uv range (for instance from 2.6 ev to 3.8 ev) at a wavelength $\lambda_0$.

Another objective of the present invention is to create a method for making such a function layer. A third objective of the present invention creates an optical functional component that shall enclose and protect the function layer of the invention.

The first objective of the invention is attained by an optical function layer characterized by being crystalline $ZnO_xS_{1-x}$.

Surprisingly it was found that the mixed system ZnOS may be synthesized in completely miscible manner as a crystalline thin film and that (during manufacture) the proportions of O and S are adjustable in the entire range (between x=0 and x=1), and accordingly the resulting function layer exhibits a sharp absorption edge with very high transmission at the higher wavelengths and very low transmission at the lower wavelengths relative to the absorption edge.

The bandgap energy $E_g(x)$ of a ternary compound semiconductor such as $ZnO_xS_{1-x}$ as rule varies non-linearly between the binary end points $E_g(ZnO)$ and $E_g(ZnS)$ expressed by the bowing parameter b which reflects the electronegative differential of sulfur and oxygen:

$$E_g(x)=xE_g(ZnO)+(1-x)E_g(ZnS)-bx(1-x)(*).$$

FIG. 1 shows the measured shift of the bandgap of alloyed $ZnO_xS_{1-x}$ samples as a function of the oxygen proportion in the range of 0 to 1. The drawn curve matches the measured points to the function.

Surprisingly the measured shift bowing parameter of 2.5 ev is much smaller than the theoretical prediction of 12 ev in US patent document 2003 0042851 A1 (Mar. 6, 2003) Iwata etal. As a result the bandgap shifts by as much as 2.6 ev (depending on error of measurement also as far as 2.4 ev), that is, into the blue spectral range compared to the predicted shift into the ir range.

FIG. 2 illustratively shows the absorption coefficient of a ZnOS layer having an oxygen proportions x=0.4 and 0.8 on a float glass substrate. The absorption constant is steep with exciton sur-elevation and it comprises a remarkable excursion (transmission differential above and below the bandgap (see FIG. 3). The invention allows adjusting in controlled manner the absorption constant within the desired range of wavelengths or energy, for instance at 380 nm, 390 nm, 400 nm. Accordingly certain ranges of the light spectrum may be cut off, for instance the uvA range.

The invention also relates to a method for preparing the above described layer. This second objective of the invention is attained by the method defined in claim 5.

The third objective of the invention relates creating an optical functional component. This objective is met by the functional component claimed in claim 13.

EXAMPLES

FIGS. 1, 2 and 3 show measured values relating to $ZnO_xS_{1-x}$ where x ranges from near 0 to 1 (ZnO).

The optical function layer may be deposited on a substrate stratum of a commonplace transparent material such as glass or plexiglass or on a non-transparent material. The function layer is crystalline and represents a transition system between ZnO (3.4 ev bandgap) and ZnS (3.7 ev bandgap). Depending on the adjusted O/S ratio, the band edge is situated in the range intermediate between about 2.5 and 3.7 ev and between 2.5 and 3.9 ev when taking into account possible errors of measurement. In this manner a function layer may be manufactured to exhibit the desired bandgap.

In the manufacture of the invention, the substrate is coated using a known thin film deposition procedure such as sputtering, chemically precipitating from gas phases (CVD, MOCVD), Sol-Gelling, evaporating, pyrolyzing the layer of the invention onto said substrate.

A modification of the method of the invention, offering an advantageous implementing mode, is attained when first a nucleating stratum is deposited on the substrate and the function layer is deposited on said stratum. Appropriate nucleating strata in particular are those exhibiting a similar structure and lattice constant, in particular at the function layer's temperature of deposition.

The growth of the $ZnO_xS_{1-x}$ layer can be improved in that manner and the required substrate temperature may be lowered. This approach is advantageous on one hand as regards process costs because eliminating time consuming and power consuming substrate preheating, and on the other hand the substrate is shielded against damaging factors which are specially significant in organic materials.

Further details and advantageous additional illustrative implementations of the invention are discussed below in relation to the shown illustrative implementing modes shown kin the drawings and in relation to the dependent claims.

DESCRIPTION OF THE PREFERRED EMBODIMENTS

Figure 1:
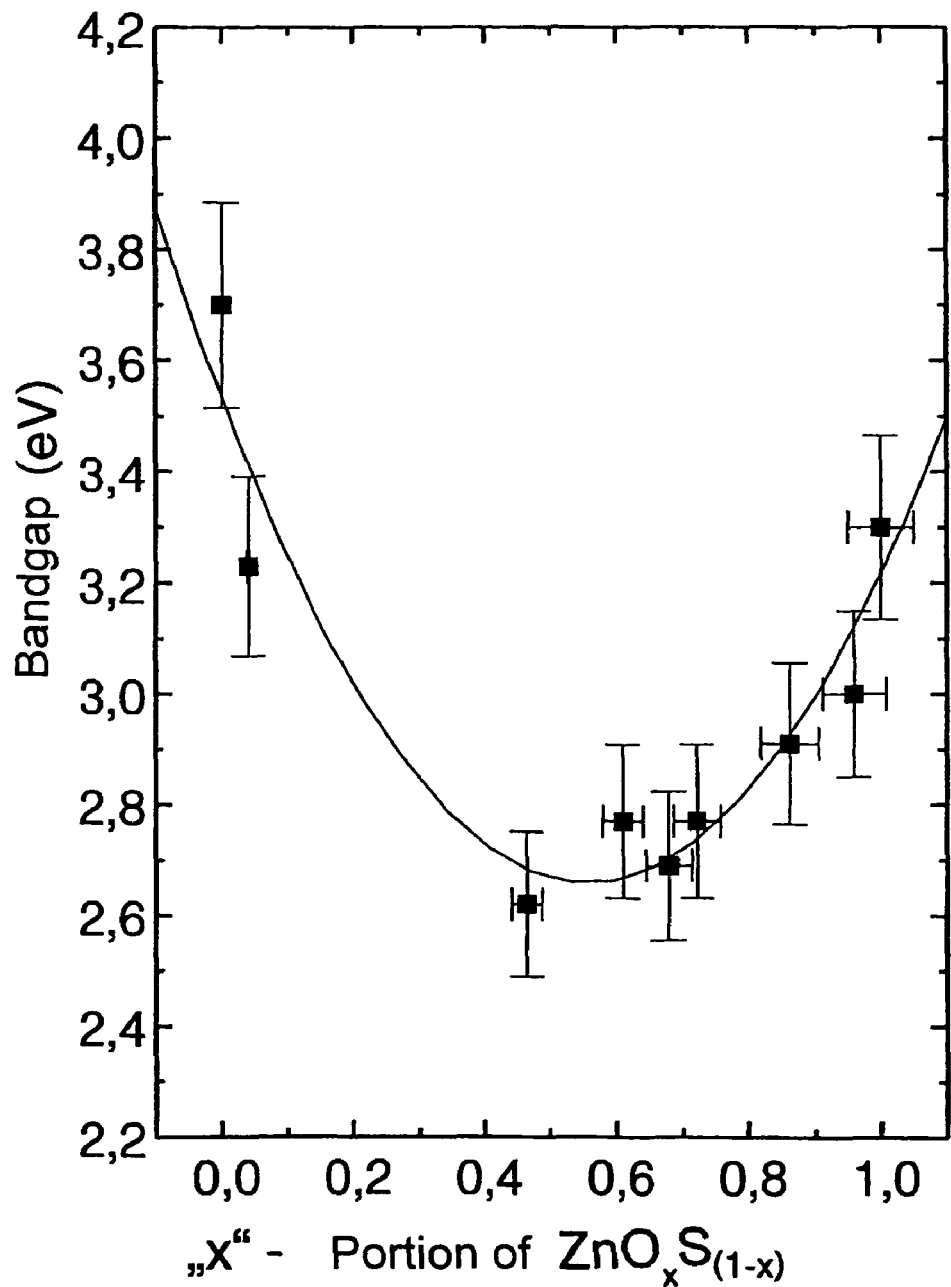
FIG. 1 shows the bandgap shift (in ev) of alloyed $ZnO_xS_{1-x}$ layers as a function of the oxygen proportion x in the range 0<x<1.

FIG. 1 shows the bandgap as a function of the oxygen proportion x for 9 different $ZnO_xS_{1-x}$ function layers. It is easily noted that in the range from about 3.9 ev down to about 2.4 ev, the bandgap is easily adjustable, when the oxygen proportion is being varied in the range of x=0 to x=1. In principle the oxygen content also may be varied by using a ZnO target instead of a ZnS target and when the adjustment is applied to sulfur.

Figure 2:
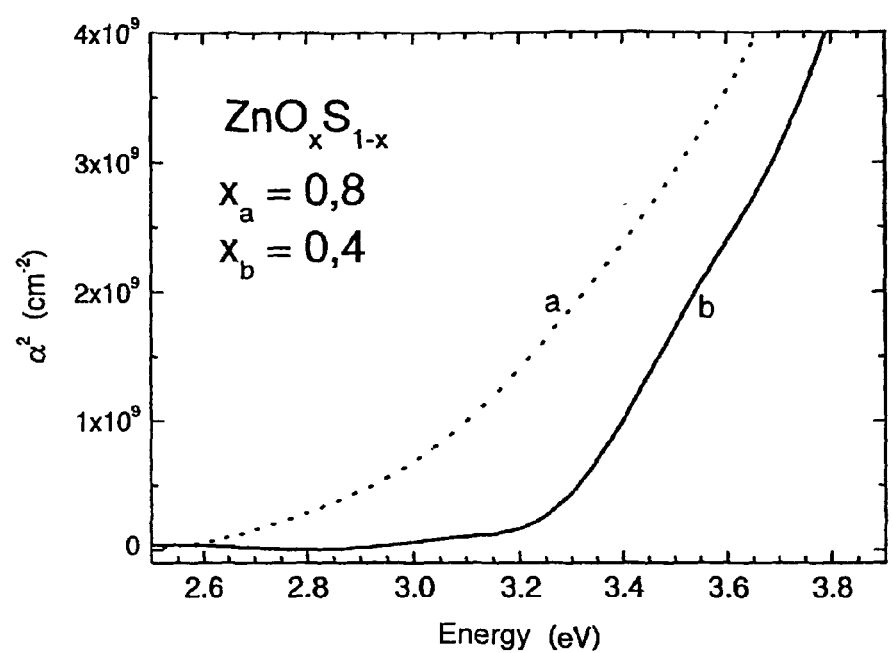
FIG. 2 shows the square of the absorption coefficient ($\alpha^2$ in $cm^2$) of two function layers of the invention on the float glass substrate with oxygen proportions $x_a$=80% and $x_b$=40%) as a function of energy in ev.

FIG. 2 shows the manifest displaceability of the bandgap when selecting the oxygen proportion x in the function layer. Similar considerations apply to varying the sulfur content (see above).

Figure 3:
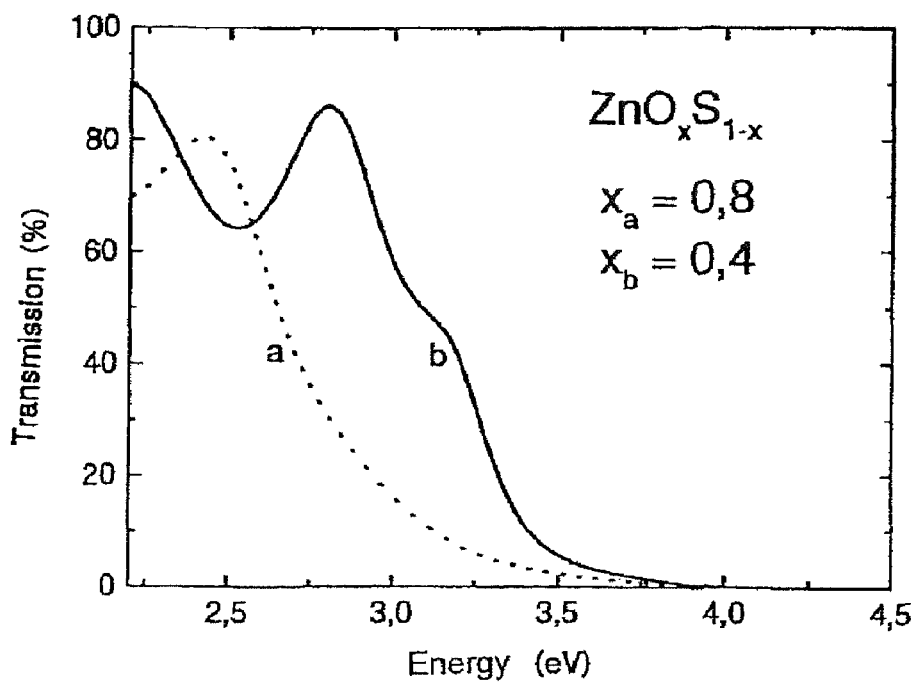
FIG. 3 shows the transmission (in %) of the two function layers of FIG. 2 ($x_a$=80% and $x_b$=40%), with a float glass substrate, in the region of the absorption constant, depending on the energy ev.

FIG. 3 shows the manifest drop in transmission from about 80% to nearly 0% within a band energy of about 0.75 ev.

Figure 4:
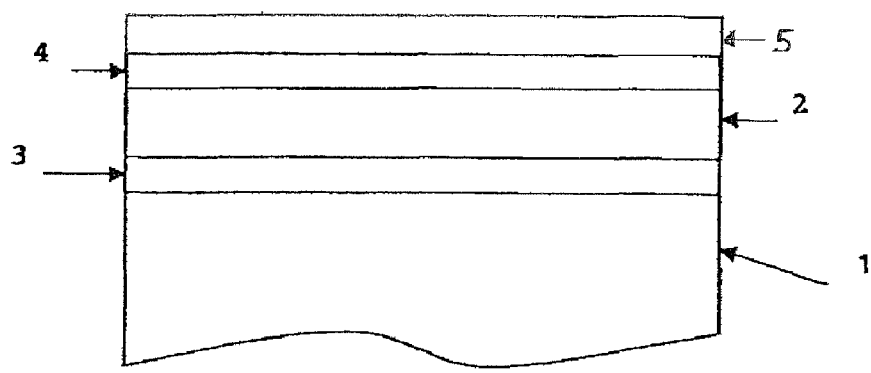
FIG. 4 shows the physical structure of a strata system acting as an optical functional component on a substrate comprising an upward nucleating stratum to improve the deposition of the function layer, the function layer per se, and above it a protective stratum.

FIG. 4 shows an optical functional component composed of a stratified system comprising a function layer of the invention above a nucleating stratum deposited on a substrate. The nucleating stratum assures improved growth (at lower temperatures of deposition).

To avoid degrading the effectiveness of the function layer due to mechanical or chemical damage or soiling, it is furthermore fitted with a protective cover stratum. Applicable protective strata may be selected from the group of $SiO_2$, SiN, SiON, $Al_2O_3$ and other optically transmitting and sufficiently hard strata.

Obviously other and different protective strata may be also configured above the first stratum or underneath the substrate.

In a particularly advantageous design of the functional component, an antioxidation stratum (5) is configured above the optical function layer and/or underneath the substrate.

A function layer and its manufacture are illustrated below. ZnS was selected as the target material, and the oxygen proportion parameter x in the resulting layer and hence the bandgap was adjusted by the oxygen feed flow.

Due to this result, it can be inferred from FIG. 1 that the function layer exhibits a bandgap of approximately 2.7 to 2.9 ev. Because of the similar oxygen proportion, the curves of the absorption coefficient and the transmission coefficient are similar to those (see FIGS. 2, 3) for $x_b$=0.4.

The function layer of the invention in general can be used wherever deposition is feasible onto a substrate and the substrate per se requires being protected against incident uv radiation, or materials situated underneath it. Consequently the following non-limiting examples of applicable fields are: (a) coatings for architectural glass; (b) uv protective glasses/glazing for automobiles, sun spectacles, tanning beds, foodstuff wrappings, etc.; (c) textiles for human wear or textiles in general.

Also because of the reduction in reflection, the optical function layer may be used as a substitute for dielectric layers in opto-electronic applications.

It is at once clear to the expert that the function layer also may be applied to flexible substrates.

Again expert does understand that the function layer may be used as an anti-reflection coating.

| Sample | ZnOS #077 | |
|---|---|---|
| Substrate | Sapphire (alternatively also Suprasil or float glass) | |
| Chamber pressure | $4.0\ 10^{-3}$ pa | |
| Target | ZnS | |
| Layer | $ZnO_xS_{1-x}$ | |
| Ar gas flow | 4.2 sccm | |
| $O_2$ gas flow | 0.9 sccm | |
| | Pre-sputtering (cleaning) | Sputtering (layer deposition) |
| Pressure | 2.1 pa | 2.0 pa |
| Sputtering power | 300 w | 300 w |
| Self-charging Target-substrate voltage | 3.3 kv | 3.15 kv |
| Substrate temperature | 300° C. | 300° C. rising to 360° C. |
| Sputtering time | 10 min | 30 min |
| Layer composition in % by atoms | | |
| Zn | O | S |
| 54 | 33 | 12 |

| List of References | |
|---|---|
| 1 | substrate |
| 2 | function layer |
| 3 | nucleating stratum |
| 4 | protective coating |
| 5 | anti-oxidation coating |

The invention claimed is:

1. An optical function layer, comprising a function coating in the form of crystalline $ZnO_xS_{1-x}$ with x values from the range of x=0.4 to x=0.8, wherein the function coating exhibits a crystal structure of wurtzite and a band gap in the range between about 2.5 eV and 2.9 eV, wherein the function layer is prepared by a thin-film deposition by sputtering procedure: ZnS being the target; an Ar gas flow of 4.2 sccm at an Ar pressure of about 2.0 pa; an $O_2$ gas flow of 0.9 sccm; a sputtering power of about 300 w at a target to a substrate voltage of about 3-3.5 kv; a substrate temperature of about 300° C. to 360° C.; and a chamber pressure of 4 mpa.

2. A method for making an optical function layer comprising:
   (a) providing a non-transparent or a transparent substrate,
   (b) providing Zn in the form of ZnO and/or ZnS as ceramic targets and/or as a metal target,
   c) feeding oxygen in the form of $O_2$, $H_2O$, and/or feeding sulfur, in the form of $H_2S$ and adjusting the feed according to a desired absorption edge wavelength,
   (d) depositing a function coating in the form of crystalline $ZnO_xS_{1-x}$ on the substrate according to a desired layer thickness, wherein x values from the range of x=0.4 to x=0.8, wherein the function coating exhibits a crystal structure of wurtzite and a band gap in the range between about 2.5 eV and 2.9 eV.

3. The method according to claim 2, wherein the steps (a) through (d) are carried out in part or in whole by sputtering procedure.

4. The method according to claim 3, wherein the sputtering is employed ahead of the step making function layer deposition in the step (d) by depositing a nucleating stratum on the substrate to allow lowering the required standard sputtering temperature in the absence of a nucleating stratum and/or improving the growth of the function layer on the nucleating stratum.

5. The method according to claim 2, wherein when simultaneously using ZnO and ZnS as targets in a sputtering procedure, the selection of an adjusted $O_2$ to S ratio determines an absorption constant position.

6. The method according to claim 2, wherein the non-transparent substrate is metallic and the transparent substrate is one of glass, plexiglass, or a polymer foil.

7. An optical function component comprising the optical function layer of claim 1, a substrate, one or both of at least one protective stratum, and at least one anti-oxidation stratum.

8. A method of applying a coating to a material for protection against UV radiation, comprising applying the optical function layer of claim 1 to the material.

9. The method according to claim 8, wherein the material is protecting one of an airplane window, part of an outer skin of an airplane, glass or glazing used in architecture or spectacles, glazing or plastic parts in automobiles, plastics and textiles.

10. A method of using a dielectric coating in an opto-electronic application, comprising using the optical function layer of claim 1 as a dielectric coating.

* * * * *